United States Patent
Lee et al.

(10) Patent No.: US 9,299,948 B2
(45) Date of Patent: Mar. 29, 2016

(54) ORGANIC LIGHT EMITTING DISPLAY DEVICE

(71) Applicants: Min Tak Lee, Yongin (KR); Kyu Seok Kim, Yongin (KR)

(72) Inventors: Min Tak Lee, Yongin (KR); Kyu Seok Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 198 days.

(21) Appl. No.: 13/748,992

(22) Filed: Jan. 24, 2013

(65) Prior Publication Data
US 2014/0048779 A1   Feb. 20, 2014

(30) Foreign Application Priority Data

Aug. 14, 2012 (KR) .................. 10-2012-0088986

(51) Int. Cl.
*H01L 35/24* (2006.01)
*H01L 51/52* (2006.01)
*H01L 27/32* (2006.01)

(52) U.S. Cl.
CPC ............ *H01L 51/52* (2013.01); *H01L 27/3244* (2013.01); *H01L 27/3283* (2013.01)

(58) Field of Classification Search
CPC ............ H01L 27/3244; H01L 2227/32; H01L 2227/326; H01L 2251/566
USPC ................................................ 257/40, 57, 59
See application file for complete search history.

(56) References Cited

U.S. PATENT DOCUMENTS

2005/0020175 A1* 1/2005 Tamashiro et al. ............. 445/24

FOREIGN PATENT DOCUMENTS

| KR | 10-2005-0050650 A | 5/2005 |
| KR | 10-2007-0004741 A | 1/2007 |
| KR | 10-2012-0026392 A | 3/2012 |

* cited by examiner

*Primary Examiner* — Samuel Gebremariam
(74) *Attorney, Agent, or Firm* — Lee & Morse, P.C.

(57) ABSTRACT

An organic light emitting display device includes an organic light emitting display panel including first to third pixels that emit light of different colors, a wavelength of a color light emitted from the third pixel being shorter than wavelengths of color lights emitted from the first and second pixels, a window on an upper portion of the display panel, and a light shielding pattern on the window, the light shielding pattern being adjacent to an outline of the third pixel.

20 Claims, 10 Drawing Sheets

ORGANIC LIGHT EMITTING DISPLAY DEVICE

CROSS-REFERENCE TO RELATED APPLICATION

This application claims priority under 35 U.S.C. §119 to Korean Patent Application No. 10-2012-0088986, filed on Aug. 14, 2012 in the Korean Intellectual Property Office, the disclosure of which is incorporated herein in its entirety by reference.

BACKGROUND

1. Field

Embodiments relate to an organic light emitting display device.

2. Description of the Related Art

According to a trend of providing lightweight and thin-film home display devices such as TVs and monitors, and also, portable display devices such as notebook computers, cellular phones, and portable media players (PMPs), various flat display devices have been developed. The flat display devices include a display panel for displaying images, and may be classified as liquid crystal display devices, organic light emitting display devices, and electrophoretic display devices according to the kind of display panels.

SUMMARY

Embodiments are directed to an organic light emitting display device that includes an organic light emitting display panel including a first pixel, a second pixel, and a third pixel, which emit light of different colors, a wavelength of a color light emitted from the third pixel being shorter than wavelengths of color lights emitted from the first and second pixels, a window on an upper portion of the display panel, and a light shielding pattern on the window, the light shielding pattern being adjacent to an outline of the third pixel.

The light shielding pattern may be on an upper surface of the window.

The organic light emitting display device may further include a coating layer on the upper surface of the window and the light shielding pattern.

The light shielding pattern may be on a lower surface of the window.

The light shielding pattern may be adjacent to two facing side surfaces of the third pixel.

The light shielding pattern may surround the third pixel.

Embodiments are also directed to an organic light emitting display device that includes an organic light emitting display panel including a first pixel, a second pixel, and a third pixel, which emit light of different colors, a wavelength of a color light emitted from the third pixel being shorter than wavelengths of color lights emitted from the first and second pixels, a window on an upper portion of the display panel, and a diffusion pattern on the window, the diffusion pattern being adjacent to an outline of the third pixel.

The diffusion pattern may include a plurality of diffusion particles. A diameter of the diffusion particles may be equal to or less than $\frac{1}{10}$ of the wavelength of the color light emitted from the third pixel.

The color light emitted from the third pixel may be blue. The diameter of the diffusion particle may be equal to or less than 45 nm.

The diffusion pattern may be on an upper surface of the window.

The organic light emitting display device may further include a coating layer on the upper surface of the window and the diffusion pattern.

The diffusion pattern may be on a lower surface of the window.

The diffusion pattern may be adjacent to two facing side surfaces of the third pixel.

The diffusion pattern may surround the third pixel.

Embodiments are also directed to an organic light emitting display device that includes an organic light emitting display panel including a first pixel, a second pixel, and a third pixel, which emit light of different colors, a wavelength of a color light emitted from the first pixel being longer than wavelengths of color lights emitted from the second and third pixels, a window on an upper portion of the display panel, and a first diffusion pattern on the window, the first diffusion pattern overlapping the first pixel.

The first diffusion pattern may be on an upper surface of the window.

The organic light emitting display device may further include a coating layer on the upper surface of the window and the first diffusion pattern.

The first diffusion pattern may be on a lower surface of the window.

The organic light emitting display device may further include a second diffusion pattern on the window, the second diffusion pattern overlapping the second pixel. The wavelength of the color light emitted from the second pixel may be longer than the wavelength of the color light emitted from the third pixel. The first diffusion pattern and the second diffusion pattern may be on an upper surface of the window.

The organic light emitting display device may further include a second diffusion pattern on the window, the second diffusion pattern being arranged to overlap the second pixel. The wavelength of the color light emitted from the second pixel may be longer than the wavelength of the color light emitted from the third pixel. The first diffusion pattern and the second diffusion pattern are on a lower surface of the window.

BRIEF DESCRIPTION OF THE DRAWINGS

Features will be more apparent from the following detailed description taken in conjunction with the accompanying drawings, in which.

DETAILED DESCRIPTION

Embodiments will now be described more fully hereinafter with reference to the accompanying drawings, in which preferred embodiments are shown. These, however, may be embodied in different forms and should not be construed as limited to the embodiments set forth herein. Rather, these embodiments are provided so that this disclosure will be thorough and complete, and will fully convey the scope thereof to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, preferred embodiments will be described in detail with reference to the accompanying drawings.

Figure 1:
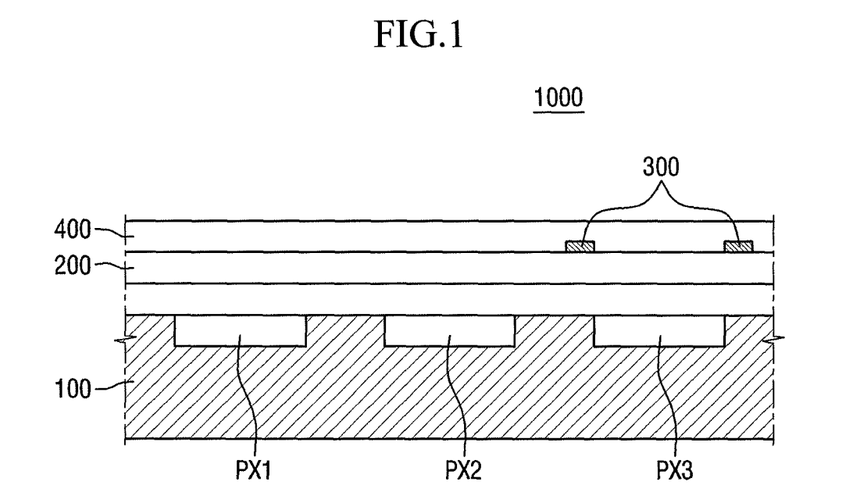
FIG. 1 is a cross-sectional view of an organic light emitting display device according to an embodiment.

FIG. 1 is a cross-sectional view of an organic light emitting display device according to an embodiment.

Referring to FIG. 1, an organic light emitting display device 1000 includes an organic light emitting display panel 100, a window 200, and a light shielding pattern 300.

The organic light emitting display panel 100 includes first to third pixels PX1, PX2, and PX3. The first to third pixels PX1, PX2, and PX3 may be divided to be spaced apart from one another by a non-light emission region. The first to third pixels PX1, PX2, and PX3 may emit color lights having different wavelengths. The wavelength of a color light emitted from the third pixel PX3 may be shorter than the wavelengths of color lights emitted from the first and second pixels PX1 and PX2, and the wavelength of the color light emitted from the second pixel PX2 may be shorter than the wavelength of the color light emitted from the first pixel PX1. For example, the first pixel PX1 may emit a red light, the second pixel PX2 may emit a green light, and the third pixel PX3 may emit a blue light.

The window 200 may be arranged on an upper portion of the organic light emitting display panel 100. More specifically, the window 200 may be arranged on paths of lights emitted from the first to third pixels PX1, PX2, and PX3. The window 200 may protect the organic light emitting display panel 100 from an external impact. The window 200 may be formed of a transparent material to transmit the light emitted from the first to third pixels PX1, PX2, and PX3. For example, the window 200 may be formed of glass, PE (polyethyleneterephthalate), PC (polycarbonate), PES (polyethersulfone), PI (polyimide), or PMMA (polymethylmethacrylate), as examples.

The light shielding pattern 300 may be formed of a material that does not transmit the light, and more specifically, may be formed of a black material. In some embodiments, the light shielding pattern 300 may be formed of a black semi-transparent material to shield only a part of the light.

The light shielding pattern 300 may be arranged on the upper surface of the window 200. More specifically, the light shielding pattern 300 may be arranged on the upper surface of the window 200 to be adjacent to the outline of the third pixel PX3. The light shielding pattern 300 may be arranged adjacent to the outline of the third pixel PX3, and may partially shield the light emitted from the third pixel PX3 as seen to be aside from the front of the organic light emitting display device 1000. Accordingly, in the case of seeing the organic light emitting display device from the side rather than in the case of seeing the organic light emitting display device from the front, the light emitted from the third pixel PX3, which emits light having a relatively short wavelength compared to the first pixel PX1 and the second pixel PX2, can be further shielded. If it is assumed that the angle that is formed between a user's gaze and the upper surface of the organic light emitting display panel 100 that is the light emitting surface is a watching angle, the light emitted from the third pixel PX3 can be further shielded. In the organic light emitting display device according to an embodiment, the light shielding pattern 300 is arranged adjacent to the outline of the third pixel PX3, and the shielding degree of light emitted from the third pixel PX3 having a relatively short wavelength becomes higher as the degree of secession of the watching angle from 90° becomes greater. Accordingly, the blue shift of the color depending on the watching angle can be compensated for, and the color shift can be reduced even if the watching angle is changed.

Figure 2:
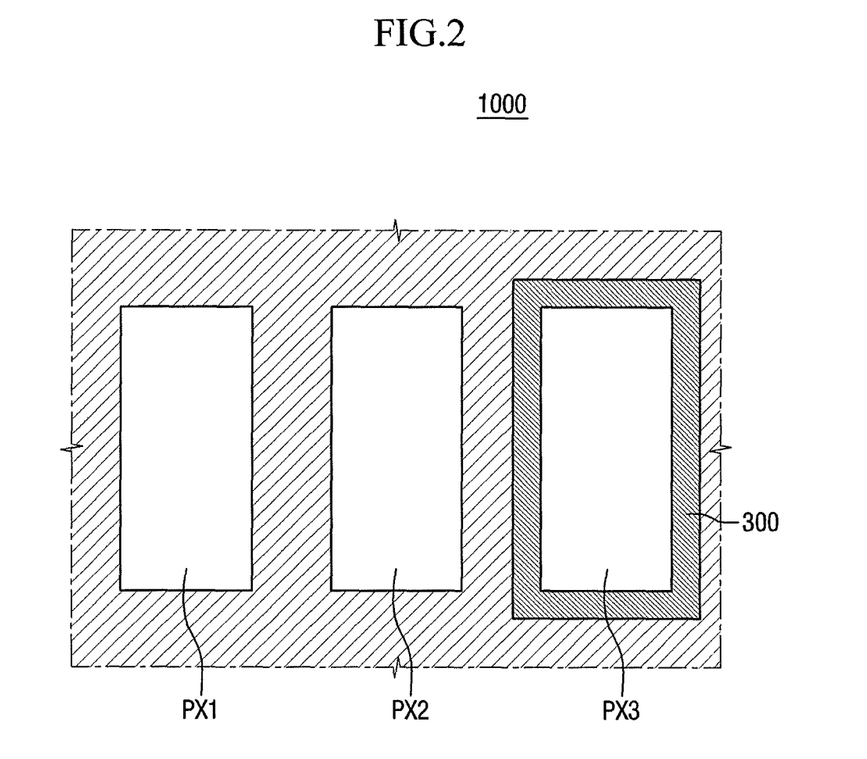
FIG. 2 is a plan view of an organic light emitting display device according to an embodiment.

Hereinafter, referring to FIG. 2, the light shielding pattern 300 will be described in more detail. FIG. 2 is a plan view of an organic light emitting display device according to an embodiment.

Referring to FIG. 2, a light shielding pattern 300 may be arranged to surround the third pixel PX3. If the light shielding pattern 300 is arranged to surround the third pixel PX3, the light shielding pattern 300 shields the light emitted from the third pixel PX3 even if the watching angle deviates from 90° in the horizontal and vertical directions, and the color shift depending on the change of the watching angle can be reduced.

FIGS. 1 and 2 illustrate that the light shielding pattern 300 is formed to meet properly with the edge of the third pixel PX3. However, in other implementations, the light shielding pattern 300 may partially overlap the third pixel PX3, or may be arranged to be spaced apart from the edge of the third pixel PX3 for a predetermined distance on a plan view.

Although FIG. 2 illustrates that the light shielding pattern 300 completely surround the edge of the third pixel PX3, this may be varied according to implementations. For example, the light shielding pattern 300 may be formed as plural patterns that are spaced apart from each other, or the light shielding pattern 300 may be arranged adjacent to only a partial region of the outline of the third pixel PX3 in order to differently control the color shift depending on the direction in which the organic light emitting display device 1000 is visually recognized.

Referring again to FIG. 1, the organic light emitting display device 1000 may further include a coating layer 400. The coating layer 400 may be arranged on the upper surface of the window 200 and the upper portion of the light shielding pattern 300. The coating layer 400 may prevent the light shielding pattern 300 from being worn or from separating from the window 200. In some embodiments, the coating layer 400 may be omitted.

Figure 3:
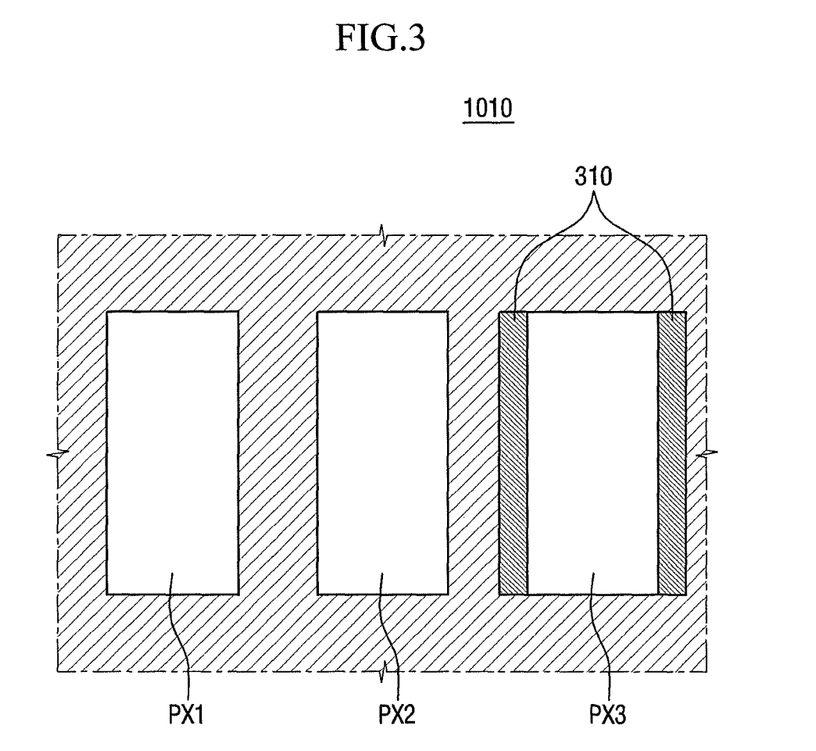
FIG. 3 is a plan view of an organic light emitting display device according to another embodiment.

Hereinafter, referring to FIG. 3, another embodiment will be described. FIG. 3 is a plan view of an organic light emitting display device according to another embodiment.

Referring to FIG. 3, a light shielding pattern 310 may be arranged adjacent to two side surfaces, which face each other, of the third pixel PX3. That is, the light shielding pattern 310 may be arranged adjacent to the left side and the right side of the outline of the third pixel PX3, but may be omitted from a region that is adjacent to the upper side and the lower side thereof. In the case of a large-size display device such as a TV, since the change of the watching angle is more likely to occur in the horizontal direction rather than the vertical direction, the light shielding pattern 310 is arranged adjacent in the horizontal direction of the third pixel PX3 to selectively relieve the color shift depending on the change of the watching angle in the horizontal direction. In other aspects, the light shielding pattern 310 may be substantially the same as the light shielding pattern 300 illustrated in FIG. 1.

The cross-sectional view of the organic light emitting display device 1010 in FIG. 3 may be substantially the same as that in FIG. 1.

Figure 4:
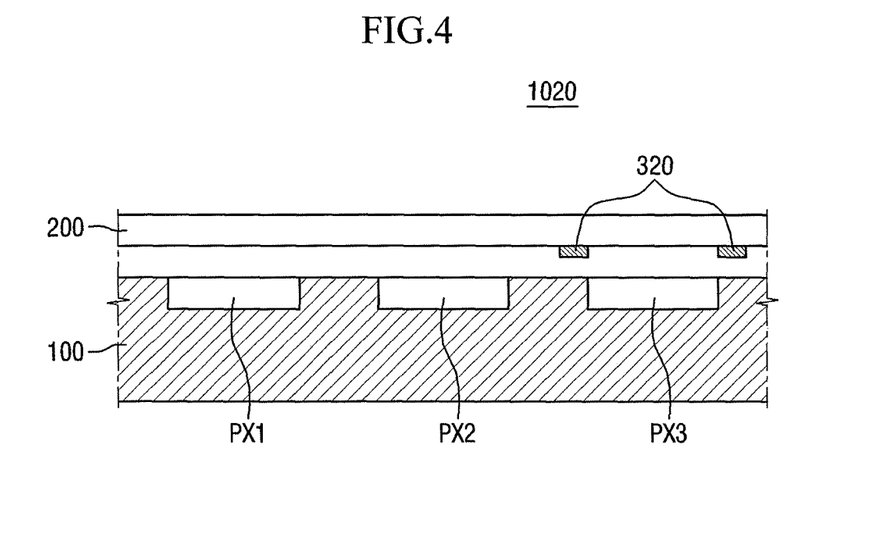
FIG. 4 is a cross-sectional view of an organic light emitting display device according to still another embodiment.

Hereinafter, referring to FIG. 4, still another embodiment will be described. FIG. 4 is a cross-sectional view of an organic light emitting device according to still another embodiment.

Referring to FIG. 4, an organic light emitting display device 1020 may include a light shielding pattern 320 arranged on the lower surface of the window 200. More specifically, the light shielding pattern 320 may be arranged on the lower surface of the window 200 to be adjacent to the outline of the third pixel PX3. Even if the light shielding pattern 320 is arranged on the lower surface of the window 200, the shielding degree obtained by the light shielding pattern 320 of light emitted from the third pixel PX3 having a relatively short wavelength can be heightened as the degree of secession of the watching angle from 90° becomes greater. Thus, the color shift depending on the watching angle can be reduced. If the light shielding pattern 320 is arranged on the lower surface of the window 200, the light shielding pattern 320 is located inside the organic light emitting display device 1020, and thus the light shielding pattern 320 may be prevented from being worn. A separate coating layer may be omitted in the organic light emitting display device 1020. In other aspects, the light shielding pattern 320 may be substantially the same as the light shielding pattern 300 illustrated in FIG. 1.

The plan view of the organic light emitting display device 1020 may be substantially the same as the plan view of the organic light emitting display device 1000 or 1010 in FIG. 2 or 3.

Figure 5:
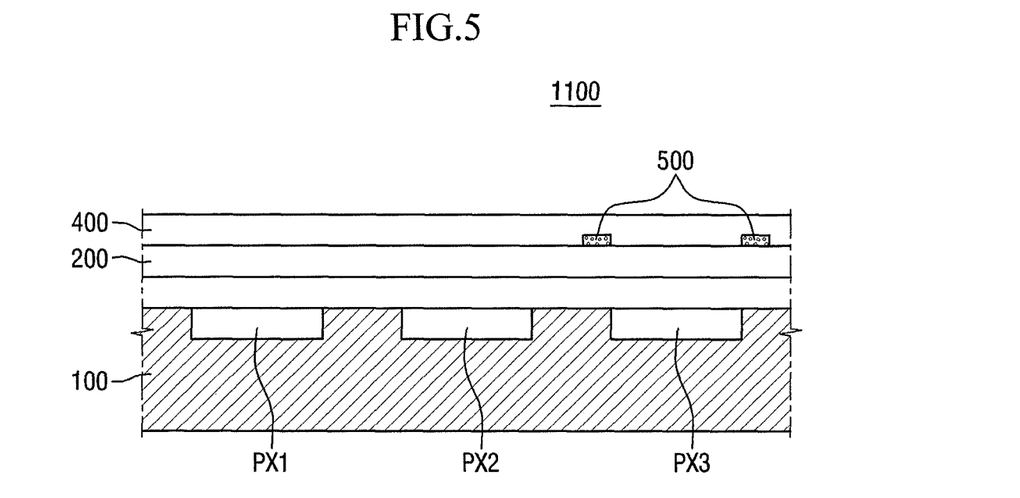
FIG. 5 is a cross-sectional view of an organic light emitting display device according to still another embodiment.

Hereinafter, referring to FIGS. 5 and 6, still another embodiment will be described. FIG. 5 is a cross-sectional view of an organic light emitting device according to still another embodiment.

Referring to FIG. 5, an organic light emitting display device 1100 includes an organic light emitting display panel 100, a window 200, and a diffusion pattern 500.

The diffusion pattern 500 may be arranged on the upper surface of the window 200. More specifically, the diffusion pattern 500 may be arranged on the upper surface of the window 200 to be adjacent to the outline of the third pixel PX3. The diffusion pattern 500 may be arranged adjacent to the outline of the third pixel PX3, and may scatter the light emitted in the direction that deviates from the front of the third pixel PX3 to cause a part of the scattered light to propagate toward the front side. That is, the diffusion pattern 500 can decrease the quantity of light that propagates in the direction that deviates from the front, among the light emitted from the third pixel, and increase the quantity of light that propagates to the front. Accordingly, the organic light emitting display device 1100 includes the diffusion pattern 500 that is arranged on the upper surface of the window 200 to be adjacent to the outline of the third pixel PX3, and decreases the quantity of light that propagates in a direction that deviates from the front, among the light emitted from the third pixel PX3 having a relatively short wavelength. Accordingly, the blue shift of the color depending on the watching angle can be compensated for, and the shift of the color can be reduced even if the watching angle is changed.

The diffusion pattern 500 may include a plurality of diffusion particles 501. In some embodiments, the diffusion particles 501 may be particles that are small enough to generate Rayleigh scattering. The Rayleigh scattering occurs effectively as the wavelength becomes shorter, and if the diffusion particles 501 are particles that are small enough to generate the Rayleigh scattering, the light emitted from the third pixel PX3 having a relatively small wavelength among the first to third pixels PX1, PX2, and PX3 can be effectively scattered. Thus, the shift of the color depending on the change of the watching angle can be effectively reduced. For example, if the third pixel is a blue pixel, the wavelength of the blue light may be about 450 nm. The diameter of the diffusion particles 501 for the Rayleigh scattering may be equal to or smaller than 45 nm, that is, 1/10 of the wavelength of the blue light.

FIG. 5 illustrates that the diffusion pattern 500 is formed to include the diffusion particles 501. However, in other implementations, for example, the diffusion pattern may be formed to include a prism array or a plurality of lenses. Further, the diffusion pattern 500 may be formed by forming a concavo-convex shape on the surface of the window.

Figure 6:
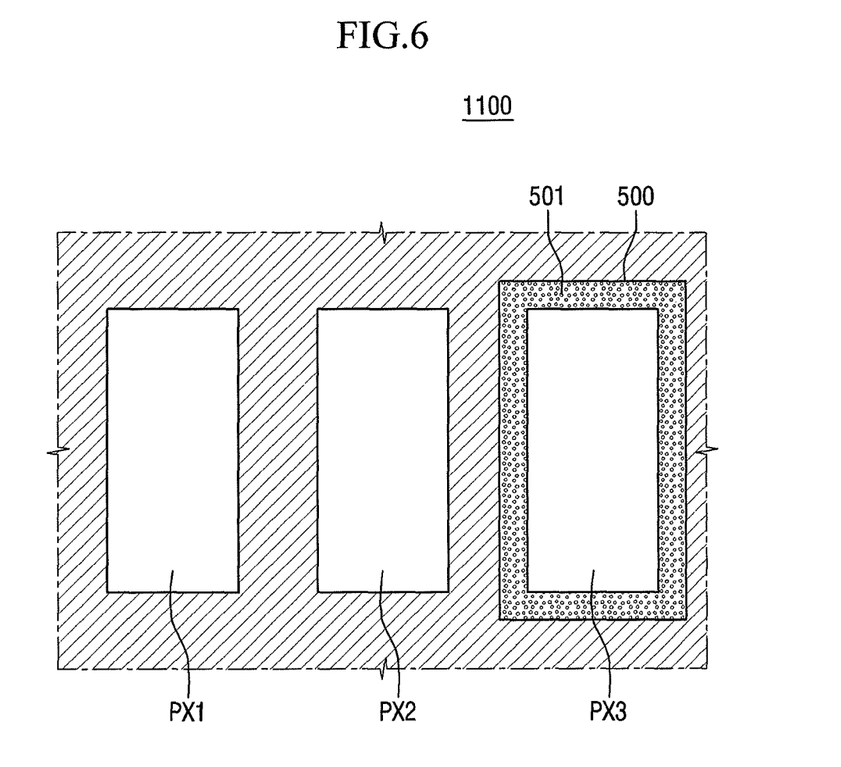
FIG. 6 is a plan view of an organic light emitting display device according to still another embodiment.

FIG. 6 is a plan view of an organic light emitting display device according to still another embodiment. Referring to FIG. 6, the diffusion pattern 500 may be arranged to surround the third pixel PX3. If the diffusion pattern 500 is arranged to surround the third pixel PX3, the diffusion pattern 500 may decrease the quantity of light that is emitted from the third pixel PX3 in a direction that deviates from the front in the horizontal and vertical directions. Thus, the shift of the color can be reduced even if the watching angle is changed in the horizontal or vertical direction.

FIGS. 5 and 6 illustrate that the diffusion pattern 500 is formed to meet with the edge of the third pixel PX3. In other implementations, the diffusion pattern 500 may partially overlap the third pixel PX3, or may be arranged to be spaced apart from the edge of the third pixel PX3 for a predetermined distance on a plan view.

Although FIG. 6 illustrates that the diffusion pattern 500 completely surround the edge of the third pixel PX3, this may be changed in other implementations. For example, the diffusion pattern 500 may be formed as plural patterns that are spaced apart from each other, or the diffusion pattern 500 may be arranged adjacent to only a partial region of the outline of the third pixel PX3 in order to differently control the color shift depending on the direction in which the organic light emitting display device 1100 is visually recognized.

Referring again to FIG. 5, the organic light emitting display device 1100 may further include a coating layer 400. The coating layer 400 may be arranged on the upper surface of the window 200 and the upper portion of the diffusion pattern 500. The coating layer 400 may prevent the diffusion pattern 500 from being worn or separating from the window 200. In some implementations, the coating layer 400 may be omitted.

Figure 7:
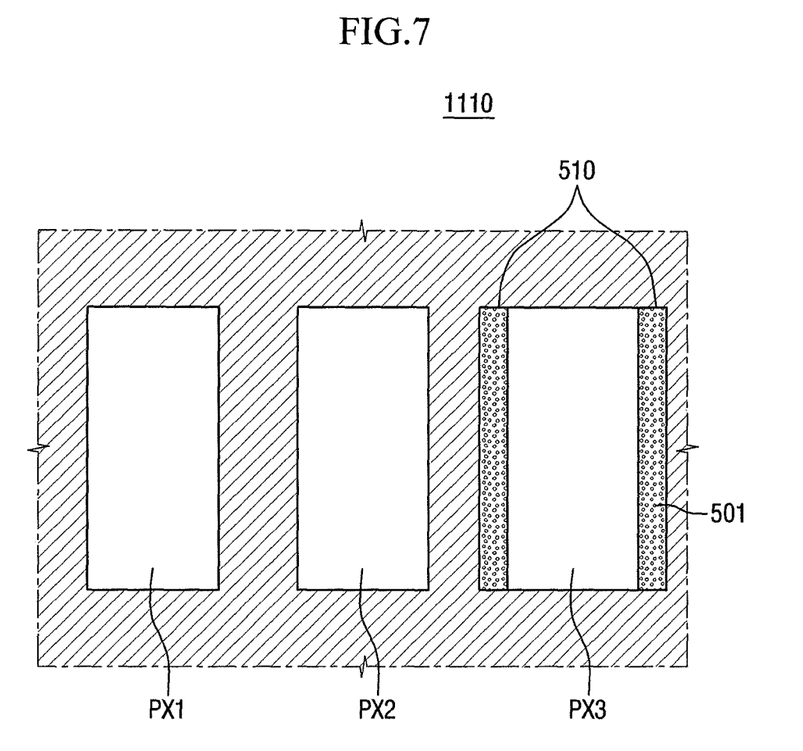
FIG. 7 is a plan view of an organic light emitting display device according to still another embodiment.

Hereinafter, referring to FIG. 7, another embodiment will be described. FIG. 7 is a plan view of an organic light emitting display device according to another embodiment.

Referring to FIG. 7, a diffusion pattern 510 may be arranged adjacent to two side surfaces of the third pixel PX3 that face each other. The diffusion pattern 510 may be arranged adjacent to the left side and the right side of the outline of the third pixel PX3, and may be omitted from a region that is adjacent to the upper side and the lower side thereof. In the case of a large-size display device such as a TV, the change of the watching angle may be more likely to occur in the horizontal direction rather than the vertical direction.

Accordingly, the diffusion pattern 510 may be arranged adjacent in the horizontal direction of the third pixel PX3 to selectively relieve the color shift depending on the change of the watching angle in the horizontal direction. In other aspects, the diffusion pattern 510 may be substantially the same as the diffusion pattern 500 illustrated in FIG. 5.

The cross-sectional view of the organic light emitting display device 1110 in FIG. 7 may be substantially the same as that in FIG. 5.

Figure 8:
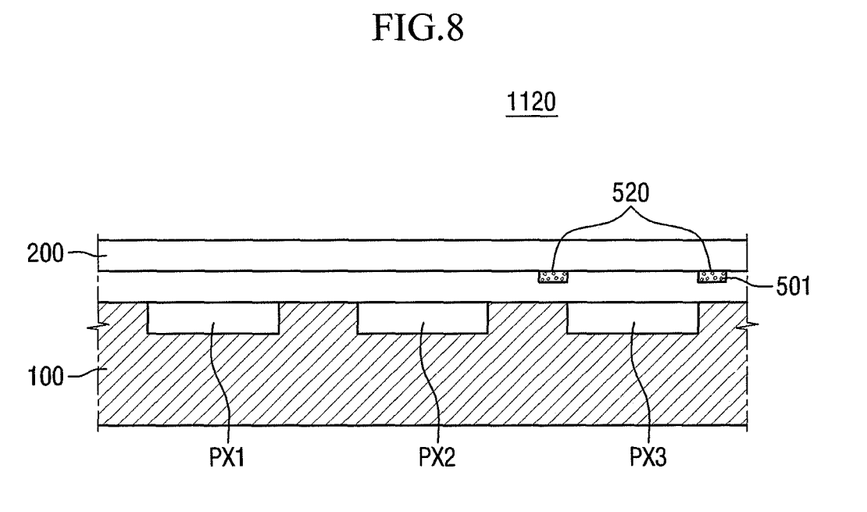
FIG. 8 is a cross-sectional view of an organic light emitting display device according to still another embodiment.

Hereinafter, referring to FIG. 8, still another embodiment will be described. FIG. 8 is a cross-sectional view of an organic light emitting device according to still another embodiment.

Referring to FIG. 8, an organic light emitting display device 1120 may include a diffusion pattern 520 arranged on the lower surface of the window 200. More specifically, the diffusion pattern 520 may be arranged on the lower surface of the window 200 to be adjacent to the outline of the third pixel PX3. Even if the diffusion pattern 520 is arranged on the lower surface of the window 200, the color shift depending on the watching angle can be reduced by decreasing the quantity of light that is emitted from the third pixel PX3 and that propagates in a direction that deviates from the front of the organic light emitting display panel 100. If the diffusion pattern 520 is arranged on the lower surface of the window 200, the diffusion pattern 520 is located inside the organic light emitting display device 1120. Thus, the diffusion pattern 520 may be prevented from being worn, and a separate coating layer may be omitted in the organic light emitting display device 1120. In other aspects, the diffusion pattern 520 may be substantially the same as the diffusion pattern 500 illustrated in FIG. 5.

The plan view of the organic light emitting display device 1120 may be substantially the same as the plan view of the organic light emitting display device 1100 or 1110 in FIG. 6 or 7.

Hereinafter, referring to FIG. 9, still another embodiment will be described.

Figure 9:
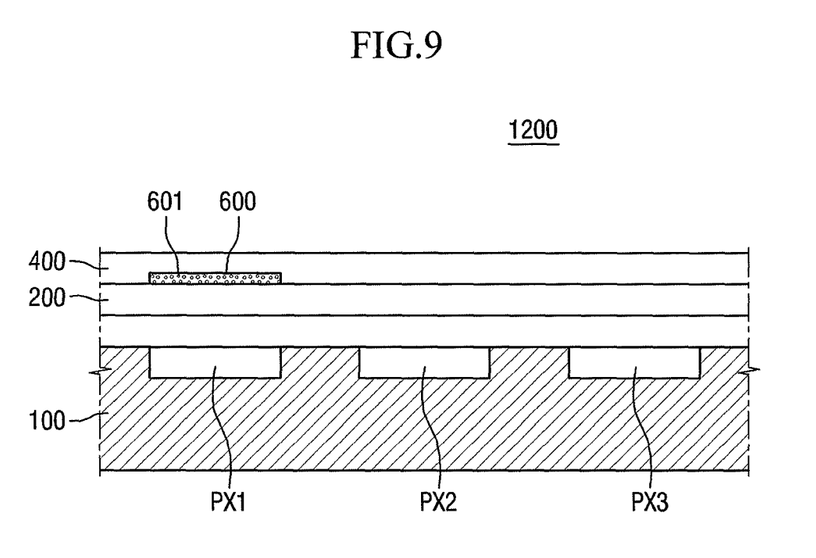
FIG. 9 is a cross-sectional view of an organic light emitting display device according to still another embodiment.

FIG. 9 is a cross-sectional view of an organic light emitting device according to still another embodiment. Referring to FIG. 9, an organic light emitting display device 1200 includes an organic light emitting display panel 100, a window 200, and a first diffusion pattern 600.

The first diffusion pattern 600 may be arranged on the upper surface of the window 200 to overlap the first pixel PX1. The first diffusion pattern 600 may scatter the light emitted from the first pixel PX1 and increase the quantity of light that is emitted from the first pixel PX1 and propagates in a direction that deviates from the front of the organic light emitting display device 100. Accordingly, if the watching angle deviates from 90°, the first diffusion pattern 600 can compensate for the blue shift of the color depending on the change of the watching angle by increasing the recognized quantity of light that is emitted from the first pixel PX1 and has a relatively long wavelength. Thus, the shift of the color can be reduced even if the watching angle is changed.

The first diffusion pattern 600 may include a plurality of diffusion particles 601. FIG. 9 illustrates that the first diffusion pattern 600 is formed to include the diffusion particles 601. In other implementations, the diffusion pattern 600 may be formed to include a prism array or a plurality of lenses. Further, the diffusion pattern 600 may be formed by forming a concavo-convex shape on the surface of the window.

The organic light emitting display device 1200 may further include a coating layer 400. The coating layer 400 may be arranged on the upper surface of the window 200 and the upper portion of the first diffusion pattern 600. The coating layer 400 may prevent the first diffusion pattern 600 from being worn or separating from the window 200. In some embodiments, the coating layer 400 may be omitted.

Figure 10:
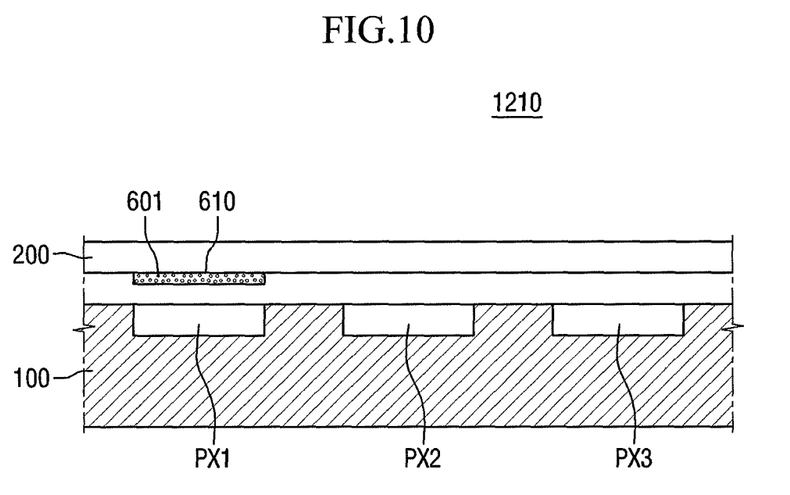
FIG. 10 is a cross-sectional view of an organic light emitting display device according to still another embodiment.

Hereinafter, referring to FIG. 10, another embodiment will be described. FIG. 10 is a cross-sectional view of an organic light emitting display device according to still another embodiment.

Referring to FIG. 10, an organic light emitting display device 1210 may include a first diffusion pattern 610 arranged to overlap the first pixel PX1 on the lower surface of the window 200. If the watching angle deviates from 90° even in a state where the first diffusion pattern 610 is arranged on the lower surface of the window 200, the first diffusion pattern 610 may compensate for the blue shift of the color depending on the change of the watching angle by increasing the recognized quantity of light that is emitted from the first pixel PX1 and has a relatively long wavelength. Thus, the shift of color can be reduced even if the watching angle is changed. If the first diffusion pattern 610 is arranged on the lower surface of the window 200, the first diffusion pattern 610 is located inside the organic light emitting display device 1210. Thus, the first diffusion pattern 610 may be prevented from being worn, and a separate coating layer may be omitted in the organic light emitting display device 1210. In other aspects, the first diffusion pattern 610 may be substantially the same as the diffusion pattern 600 illustrated in FIG. 9.

Hereinafter, referring to FIG. 11, still another embodiment will be described.

Figure 11:
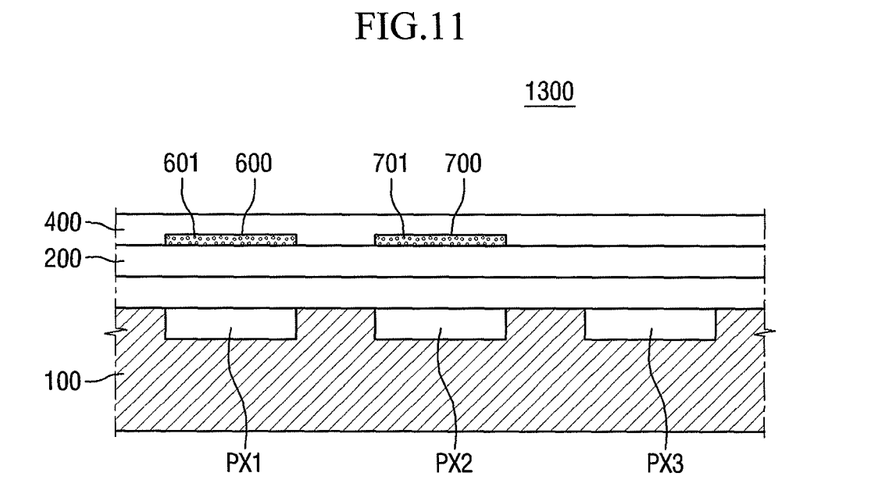
FIG. 11 is a cross-sectional view of an organic light emitting display device according to still another embodiment.

FIG. 11 is a cross-sectional view of an organic light emitting device according to still another embodiment. Referring to FIG. 11, an organic light emitting display device 1300 includes an organic light emitting display panel 100, a window 200, a first diffusion pattern 600, and a second diffusion pattern 700.

The second diffusion pattern 700 may be arranged on the upper surface of the window 200 to overlap the second pixel PX2. The second diffusion pattern 700 may scatter the light emitted from the first pixel PX1, and may increase the quantity of light that is emitted from the second pixel PX2 and propagates in a direction that deviates from the front of the organic light emitting display device 100. Accordingly, if the watching angle deviates from 90°, the first diffusion pattern 600 and the second diffusion pattern 700 can compensate for the blue shift of the color depending on the change of the watching angle by increasing the recognized quantity of light that is emitted from the first pixel PX1 and the second pixel PX2 and has a wavelength longer than the wavelength of the third pixel PX3. Thus, the shift of the color can be reduced even if the watching angle is changed.

The second diffusion pattern 700 may include a plurality of diffusion particles 701. FIG. 11 illustrates that the second diffusion pattern 700 is formed to include the diffusion particles 701. In other implementations, the diffusion pattern 700 may be formed to include a prism array or a plurality of lenses. Further, the diffusion pattern 700 may be formed by forming a concavo-convex shape on the surface of the window.

The light diffusion efficiency of the second diffusion pattern 700 may be lower than that of the first diffusion pattern 600. The wavelength of the first pixel PX1 may be longer than that of the second pixel PX2. If the watching angle deviates from 90°, the frequency may be shifted so that the recognized light becomes closer to the light emitted from the second pixel PX2 rather than the light emitted from the first pixel PX1. Accordingly, if the light diffusion efficiency of the second diffusion pattern 700 is lower than that of the first diffusion pattern 600, the light emitted from the first pixel PX1 may be made to further propagate in a direction that deviates from the front in comparison to the light emitted from the second pixel PX2 to balance the colors recognized when the watching angle is changed.

In some embodiments, in order to make the light diffusion efficiency of the second diffusion pattern 700 lower than that of the first diffusion pattern 600, the size of the diffusion particles 701 included in the second diffusion pattern 700 may be larger than the size of the diffusion particles 601 included in the first diffusion pattern 600. Further, in some embodiments, in order to make the light diffusion efficiency of the second diffusion pattern 700 lower than that of the first diffusion pattern 600, the number of diffusion particles 701 included in the second diffusion pattern 700 may be smaller than the number of diffusion particles 601 included in the first diffusion pattern 600.

Figure 12:
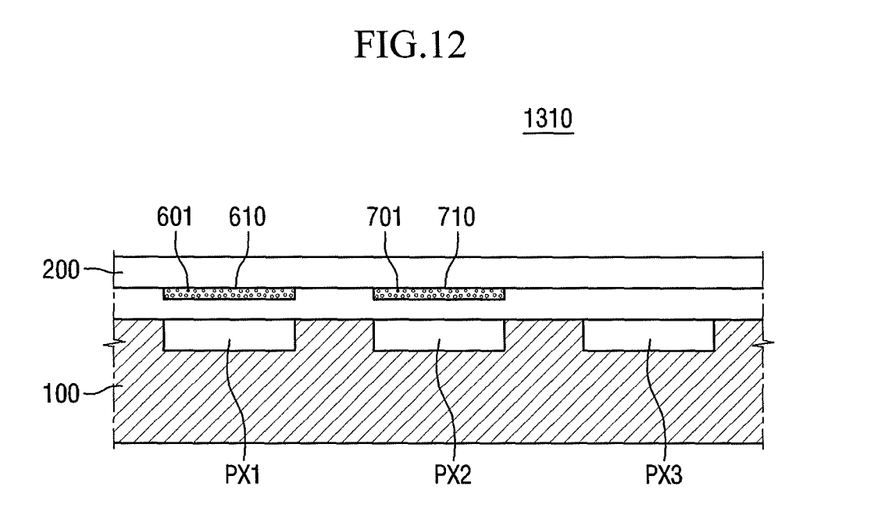
FIG. 12 is a cross-sectional view of an organic light emitting display device according to still another embodiment.

Hereinafter, referring to FIG. 12, another embodiment will be described. FIG. 12 is a cross-sectional view of an organic light emitting display device according to still another embodiment.

Referring to FIG. 12, an organic light emitting display device 1310 may include a first diffusion pattern 610 arranged to overlap the first pixel PX1 and a second diffusion pattern 710 arranged to overlap the second pixel PX2 on the lower surface of the window 200. If the watching angle deviates from 90° even in a state where the first diffusion pattern 610 and the second diffusion pattern 710 are arranged on the lower surface of the window 200, the first diffusion pattern 610 and the second diffusion pattern 710 may compensate for the blue shift of the color depending on the change of the watching angle by increasing the recognized quantity of light that is emitted from the first pixel PX1 and the second pixel PX2 and has a relatively long wavelength in comparison to the wavelength of the light emitted from the third pixel PX3. Thus, the shift of the color can be reduced even if the watching angle is changed. If the first diffusion pattern 610 and the second diffusion pattern 710 are arranged on the lower surface of the window 200, the first diffusion pattern 610 and the second diffusion pattern 710 are located inside the organic light emitting display device 1310. Thus, the first diffusion pattern 610 and the second diffusion pattern 710 may be prevented from being worn, and a separate coating layer may be omitted in the organic light emitting display device 1310.

In other aspects, the first diffusion pattern 610 and the second diffusion pattern 710 may be substantially the same as the first diffusion pattern 600 and the second diffusion pattern 700 illustrated in FIG. 11.

By way of summation and review, an organic light emitting display device may include an organic light emitting layer that is arranged between a first electrode and a second electrode. The organic light emitting layer may display grayscales corresponding to current flowing between the first electrode and the second electrode. The organic light emitting layer may emit light with various colors according to compounds thereof. For example, the organic light emitting display device may display an image by forming pixels with the organic light emitting layer that emits light of red, blue, and green. If a watching angle with respect to the organic light emitting display device is changed, a resonance distance between the first electrode and the second electrode may be changed to cause pixel colors to be shifted. More specifically, in the case of seeing the organic light emitting display device from the side rather than in the case of seeing the organic light emitting display device from the front, components having a short wavelength may become dominant, and the pixel color may be tinged with blue in comparison to the original color.

Accordingly, embodiments may relate to an organic light emitting display device that may reduce color shift depending on the change of a viewing angle. That is, embodiments may provide an organic light emitting display device that may reduce or prevent a color shift even if the viewing angle is changed.

Although preferred embodiments have been described for illustrative purposes, those skilled in the art will appreciate that various modifications, additions and substitutions are possible, without departing from the scope and spirit of the invention as disclosed in the accompanying claims.

What is claimed is:

1. An organic light emitting display device, comprising:
    an organic light emitting display panel including a first pixel, a second pixel, and a third pixel, which emit light of different colors, a wavelength of a color light emitted from the third pixel being shorter than wavelengths of color lights emitted from the first and second pixels;
    a window on an upper portion of the display panel; and
    a light shielding pattern on the window, the light shielding pattern being located adjacent to an outline of the third pixel, wherein a part of the light shielding pattern is located between the second pixel and the third pixel in plan view.

2. The organic light emitting display device of claim 1, wherein the light shielding pattern is on an upper surface of the window.

3. The organic light emitting display device of claim 2, further comprising a coating layer on the upper surface of the window and the light shielding pattern.

4. The organic light emitting display device of claim 1, wherein the light shielding pattern is on a lower surface of the window.

5. The organic light emitting display device of claim 1, wherein the light shielding pattern is adjacent to two facing side surfaces of the third pixel.

6. The organic light emitting display device of claim 1, wherein the light shielding pattern surrounds the third pixel.

7. The organic light emitting display device of claim 1, wherein the light shielding pattern shields light that is emitted by the third pixel at an angle that deviates from 90°.

8. The organic light emitting display device of claim 7, wherein the light shielding pattern shields light that is emitted by the third pixel at an angle that deviates from 90° in a horizontal direction.

9. The organic light emitting display device of claim 7, wherein an amount of shielding of light that is emitted by the third pixel increases according to an extent of deviation from 90° of an angle of light emitted from the third pixel.

10. An organic light emitting display device, comprising:
    an organic light emitting display panel including a first pixel, a second pixel, and a third pixel, which emit light of different colors, a wavelength of a color light emitted from the third pixel being shorter than wavelengths of color lights emitted from the first and second pixels;
    a window on an upper portion of the display panel; and
    a diffusion pattern on the window, the diffusion pattern being located adjacent to an outline of the third pixel, wherein a part of the diffusion pattern is located between the second pixel and the third pixel in plan view.

11. The organic light emitting display device of claim 10, wherein:
    the diffusion pattern includes a plurality of diffusion particles, and
    a diameter of the diffusion particles is equal to or less than 1/10 of the wavelength of the color light emitted from the third pixel.

12. The organic light emitting display device of claim 11, wherein:
the color light emitted from the third pixel is blue, and
the diameter of the diffusion particle is equal to or less than 45 nm.

13. The organic light emitting display device of claim 10, wherein the diffusion pattern is on an upper surface of the window.

14. The organic light emitting display device of claim 13, further comprising a coating layer on the upper surface of the window and the diffusion pattern.

15. The organic light emitting display device of claim 13, wherein the diffusion pattern is adjacent to two facing side surfaces of the third pixel.

16. The organic light emitting display device of claim 13, wherein the diffusion pattern surrounds the third pixel.

17. The organic light emitting display device of claim 10, wherein the diffusion pattern is on a lower surface of the window.

18. The organic light emitting display device of claim 10, wherein the diffusion pattern scatters light that is emitted by the third pixel at an angle that deviates from 90°.

19. The organic light emitting display device of claim 18, wherein the diffusion pattern scatters light that is emitted by the third pixel at an angle that deviates from 90° in a horizontal direction.

20. The organic light emitting display device of claim 18, wherein an amount of scattering of light that is emitted by the third pixel increases according to an extent of deviation from 90° of an angle of light emitted from the third pixel.

\* \* \* \* \*